(12) United States Patent
Lin et al.

(10) Patent No.: US 10,714,157 B1
(45) Date of Patent: Jul. 14, 2020

(54) NON-VOLATILE MEMORY AND RESET METHOD THEREOF

(71) Applicant: Winbond Electronics Corp., Taichung (TW)

(72) Inventors: Ming-Che Lin, Taichung (TW); He-Hsuan Chao, Taichung (TW); Ping-Kun Wang, Taichung (TW); Seow Fong Lim, San Jose, CA (US); Ngatik Cheung, San Jose, CA (US); Chia-Wen Cheng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/551,752

(22) Filed: Aug. 27, 2019

(51) Int. Cl.
*G11C 7/10* (2006.01)

(52) U.S. Cl.
CPC .................. *G11C 7/1096* (2013.01)

(58) Field of Classification Search
CPC .......................... G11C 16/0483; G11C 29/04
USPC ................................................ 365/218, 200
See application file for complete search history.

(56) References Cited

U.S. PATENT DOCUMENTS

| | | | |
|---|---|---|---|
| 6,963,501 B2 | 11/2005 | Shiga | |
| 7,996,634 B2 | 8/2011 | Tanaka | |
| 8,040,730 B2 | 10/2011 | Takehara et al. | |
| 8,804,429 B2 | 8/2014 | Van Tran et al. | |
| 9,443,587 B1 | 9/2016 | Chen et al. | |
| 2009/0040997 A1* | 2/2009 | Oh | H04N 21/4347 370/345 |
| 2017/0255384 A1* | 9/2017 | Hashimoto | G06F 3/061 |
| 2018/0076828 A1 | 3/2018 | Kanno | |
| 2018/0173421 A1* | 6/2018 | Sela | G06F 21/31 |
| 2020/0104504 A1* | 4/2020 | Chaiken | G06F 21/575 |

* cited by examiner

*Primary Examiner* — Michael T Tran
(74) *Attorney, Agent, or Firm* — JCIPRNET

(57) ABSTRACT

A non-volatile memory and a reset method thereof are provided. The reset method includes: performing a first reset operation on a plurality of memory cells; recording a plurality of first verifying currents respectively corresponding to a plurality of first failure memory cells; performing a second reset operation on the first failure memory cells, and verifying second failure memory cells to obtain a plurality of second verifying currents; setting a first voltage modify flag according to a plurality of first ratios between the first verifying currents and the respectively corresponding second verifying currents; and adjusting a reset voltage for performing the first reset operation and the second reset operation according to the first voltage modify flag.

20 Claims, 6 Drawing Sheets

NON-VOLATILE MEMORY AND RESET METHOD THEREOF

BACKGROUND OF THE INVENTION

1. Field of the Invention

The invention relates to a non-volatile memory and a reset method thereof, and more particularly, to a non-volatile memory that can overcome the phenomenon of reset complementary switching (Reset-CS) and a reset method thereof.

2. Description of Related Art

In non-volatile memories, especially, in resistive memories, when a reset operation is performed on a memory cell, the memory cell may generate a tunnel gap. Because this channel gap will continue to generate an electric field during set/reset operation cycles, an additional conduction path will occur and a verifying current of the memory cell will continuous to increase, resulting in the so-called reset complementary switching phenomenon.

SUMMARY OF THE INVENTION

The invention provides a non-volatile memory and a reset method thereof that can overcome the phenomenon of reset complementary switching (Reset-CS).

The reset method of non-volatile memory of the invention includes: performing a first reset operation on a plurality of memory cells; recording a plurality of first verifying currents respectively corresponding to a plurality of first failure memory cells; performing a second reset operation on the first failure memory cells, and verifying second failure memory cells to obtain a plurality of second verifying currents; setting a first voltage modify flag according to a plurality of first ratios between the first verifying currents and the respectively corresponding second verifying currents; and adjusting a reset voltage for performing the first reset operation and the second reset operation according to the first voltage modify flag.

The non-volatile memory of the invention includes a memory cell array and a controller. The controller is coupled to the memory cell array, and configured to execute each step in the reset method described above.

Based on the above, the reset method of non-volatile memory can perform multiple reset operations on the memory cells and activate the mechanism for adjusting the reset voltage according to changes in the verifying currents generated by the memory cells. Accordingly, for different characteristics of different memory cells, the reset method of the invention can perform the reset operations by adjusting the reset voltage so as to overcome the possible phenomenon of reset complementary switching.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
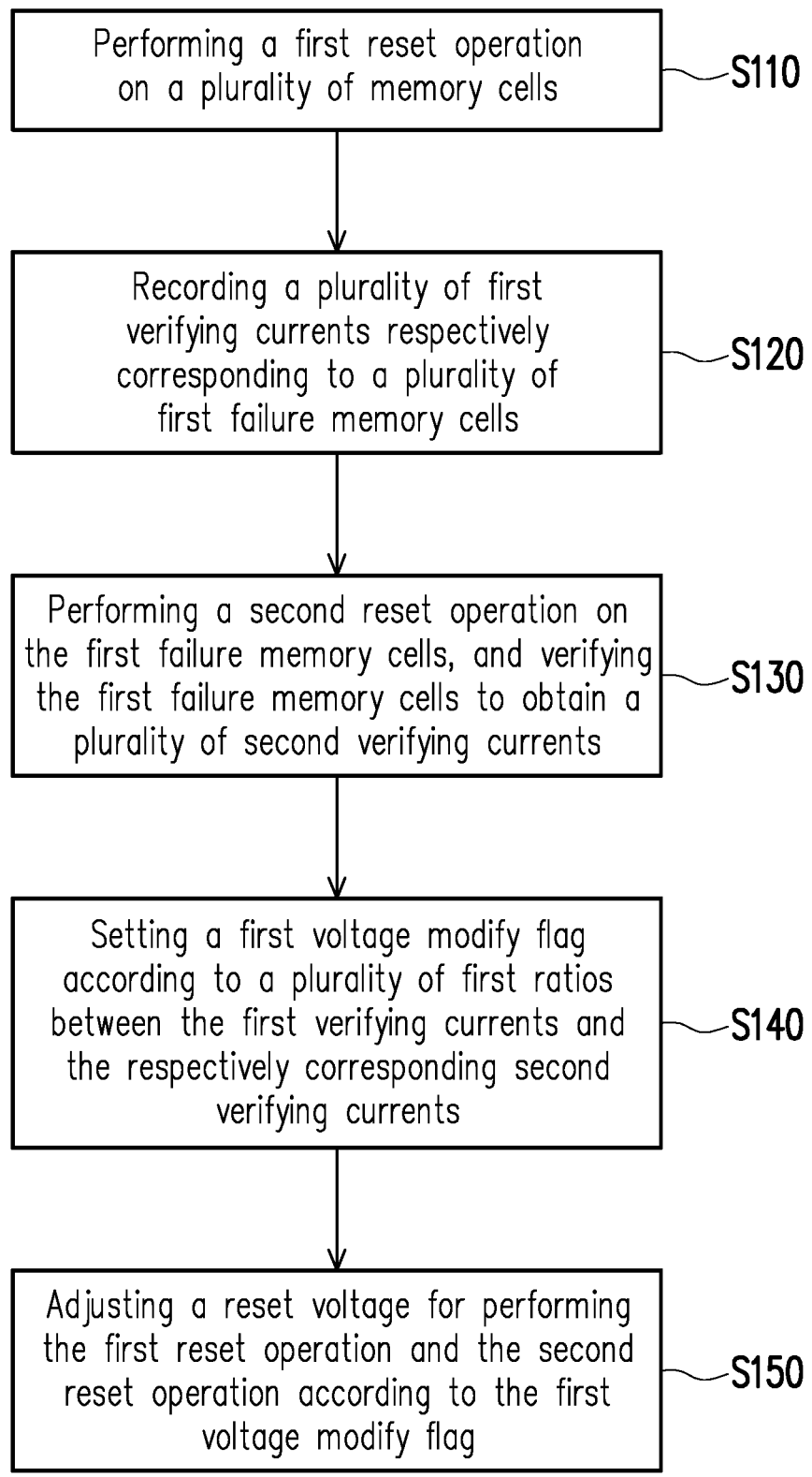
FIG. 1 is a flowchart illustrating a reset method of a non-volatile memory in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

With reference to FIG. 1, FIG. 1 is a flowchart illustrating a reset method of a non-volatile memory in an embodiment of the invention. In step S110, a first reset operation is performed on a plurality of memory cells to which a reset operation is required. Further, after the first reset operation, a verifying operation is performed on the memory cells on which the reset operation is performed. Here, the verifying operation may refer to applying a verifying voltage on the memory cells and measuring a plurality of verifying currents correspondingly generated by the memory cells. Through the verifying currents described above, it is possible to know whether the reset operation performed on each of the memory cells is fail or pass. Further, in step S110, a number of first pass memory cells determined as a reset pass and the number of first failure memory cells determined as a reset failure among all the memory cells may be calculated.

It worth mentioning that, in step S110, after the first reset operation, if it is determined that the number of the first failure memory cells is 0, it means that a memory reset procedure of the present embodiment is completed, and thus the memory reset procedure may be ended. Otherwise, after the first reset operation, if it is determined that the number of the first failure memory cells is not 0, step S120 is executed.

Then, in step S120, a plurality of first verifying currents IR1 corresponding to a plurality of first failure memory cells are recorded. Further, in step S130, a second reset operation is performed on the first failure memory cells, and a plurality of first failure memory cells are verified to obtain a plurality of second verifying currents IR2.

In step S140, a ratio between each of the first verifying currents IR1 and each of the second verifying currents IR2 of each of the first failure memory cells is calculated, and a first voltage modify flag is set according to the ratio between each of the first verifying currents IR1 and each of the second verifying currents IR2. In step S150, a reset voltage for performing the first reset operation and the second reset operation is adjusted according to the first voltage modify flag.

Here, it should be noted that, in step S140, the ratio between each of the first verifying currents IR1 and each of the second verifying currents IR2 may be compared with a preset value, and the operation of setting the voltage modify flag may be performed when at least one of the memory cell has the ratio between the first verifying current IR1 and the second verifying current IR2 being greater than the preset value. Otherwise, when all the ratios between the first verifying currents IR1 and the second verifying currents IR2 are not greater than the preset value, a value of the first voltage modify flag is maintained. In this embodiment, the operation of setting the first voltage modify flag may be used to set the first voltage modify flag to a first logic level, and the first logic level may be a logic value 1.

On the other hand, in step S150, when the first voltage modify flag is in a set state, a voltage value of the reset voltage may be correspondingly reduced.

Figure 2:
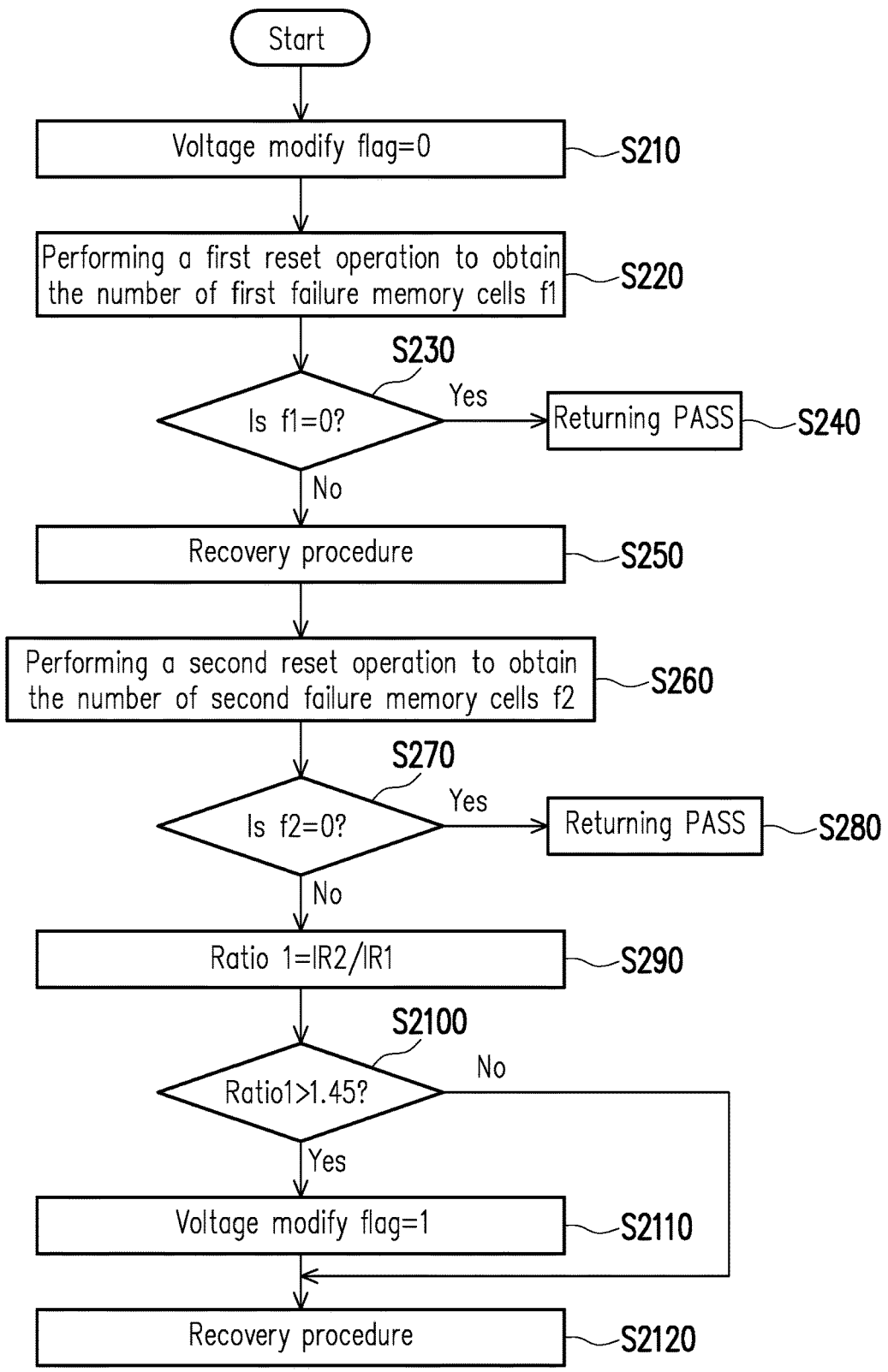
FIG. 2 is a flowchart illustrating a reset method of a non-volatile memory in another embodiment of the invention.

With reference to FIG. 2, FIG. 2 is a flowchart illustrating a reset method of a non-volatile memory in another embodiment of the invention. In FIG. 2, in step S210, an initializing operation is performed to make a voltage modify flag equal to a logic value 0. Next, in step S220, a first reset operation is performed to perform a reset operation on a plurality of memory cells and obtain the number of the first failure memory cells (=f1) on which the reset operation performed is fail.

In step S230, the number of the first failure memory cells (=f1) is determined, and when the number of the first failure memory cells is equal to 0 (f1=0), step S240 is executed to return PASS information which indicates that the reset operation is completed and all the memory cells pass the reset operation. Otherwise, if the number of the first failure memory cells is not equal to 0 (f1≠0), it means that the reset operation is not yet completed for all the memory cells, and step S250 is then executed.

The method of determining the number of the first failure memory cells may include: verifying all the reset memory cells after the first reset operation is completed and determining whether each of the memory cells is the failure memory cell according to a first verifying current IR1 correspondingly generated by each of the memory cells, so as to calculate the number of the first failure memory cells (f1).

In step S250, a recovery procedure may be performed. In this embodiment, the recovery procedure is completed by performing a set operation on the first failure memory cells.

Next, in step S260, a second reset operation is performed on the first failure memory cells, and the number of second failure memory cell f2 in this reset operation is obtained. In step S270, the number of the second failure memory cells f2 is determined, and step S280 is executed to return the PASS information when the number of the second failure memory cells f2 is equal to 0. Otherwise, when the number of the second failure memory cells f2 is not equal to 0, step S280 is executed.

The method of obtaining the number of the second failure memory cells is identical to the method of obtaining the first failure memory cells, which is not repeated hereinafter.

In step S280, for each of the second failure memory cells, a ratio Ratio1 between the second verifying current IR2 obtained from the verifying operation performed after the second reset operation and the first verifying current IR1 obtained from the verifying operation performed after the first reset operation is calculated (Ratio1=IR2/IR1). In step S2100, the ratio Ratio1 of each of the second failure memory cells is compared with a preset value (e.g., equal to 1.45). When one of the ratios Ratio1 is greater than the preset value, step S2110 is executed. Otherwise, when all the ratios Ratio1 are not greater than the preset value, step S2120 is executed.

Step S2110 is used to set a voltage modify flag to the logic value 1, and step S2120 is used to execute the recovery procedure as in step S250. Here, after the operation in step S2110 is completed, step S2120 is then executed.

Figure 3:
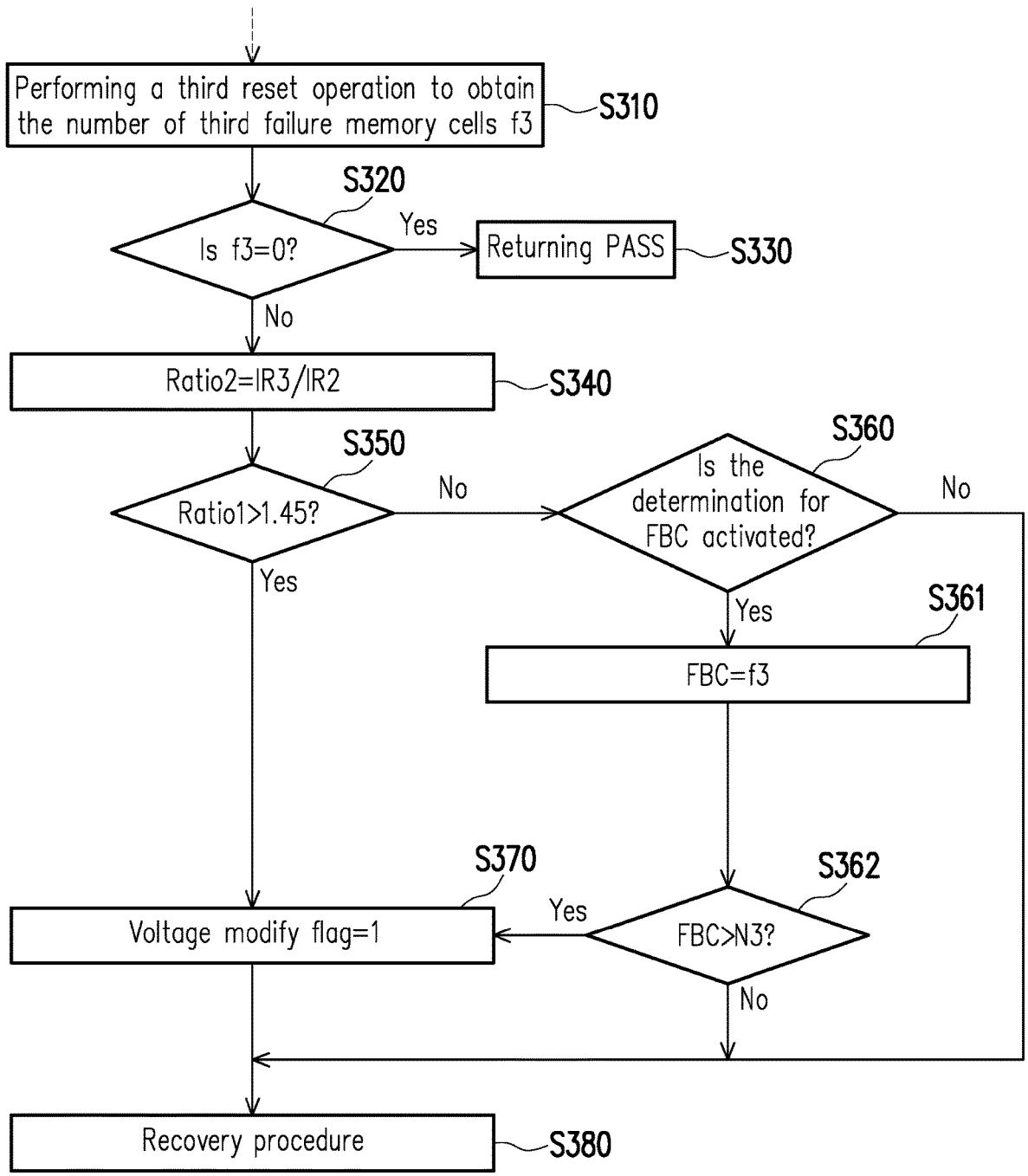
FIG. 3 is a flowchart illustrating a reset method of a non-volatile memory in yet another embodiment of the invention.

With reference to FIG. 3, FIG. 3 is a flowchart illustrating a reset method of a non-volatile memory in yet another embodiment of the invention. In continuation to the operation flow of FIG. 2, after step S2120, steps S310 to S380 illustrated in FIG. 3 may be further executed.

In step S310, a third reset operation is performed on the second failure memory cells, and the number of third failure memory cells f3 which still fail to pass the verification operation after the third reset operation is obtained. In step S320, the number of the third failure memory cells f3 is determined, and step S330 is executed to return the PASS information when the number of the third failure memory cells f3 is equal to 0. Otherwise, when the number of the third failure memory cells f3 is not equal to 0, step S340 is executed.

In step S340, for each of the third failure memory cells, a ratio Ratio2 between a third verifying current IR3 obtained from the verifying operation performed after the third reset operation and the second verifying current IR2 obtained from the verifying operation performed after the second reset operation is calculated (Ratio2=IR3/IR2). In step S350, the ratio Ratio2 of each of the third failure memory cells is compared with a preset value (e.g., equal to 1.45). When the ratio Ratio2 of at least one of the third failure memory cells is greater than the preset value, step S370 is executed. Otherwise, when all the ratios Ratio2 are not greater than the preset value, step S360 is executed.

It should be noted that, in this embodiment, the preset value in step S350 is identical to the preset value in step S290 (=1.45). In other embodiments of the invention, the preset value in step S350 may also be different from the preset value in step S290 without particular limitation.

In step S360, whether a determination mechanism for the fail bit count FBC is activated is determined, and the fail bit count FBC is made equal to the number of the third failure memory cells f3 when it is determined that the mechanism for determining the fail bit count FBC is activated (step S361). Further, in step S362, whether the fail bit count FBC is greater than a threshold N3 is determined. When the fail bit count FBC is greater than the threshold N3, step S370 is executed to set a voltage modify flag to the logic value 1. When the fail bit count FBC is not greater than the threshold N3, step S380 is executed to perform a recovery procedure. Here, the recovery procedure performed in step S380 is similar to the recovery procedures in step 2120 and step S250. On the other hand, if it is determined in step S360 that the determination mechanism for the fail bit count FBC is not activated, the recovery procedure in step S380 is directly performed.

Referring back to step S350, when it is determined in step S350 that the ratio Ratio2 is greater than the preset value, step S370 may be executed to perform the operation of setting the voltage modify flag.

Figure 4:
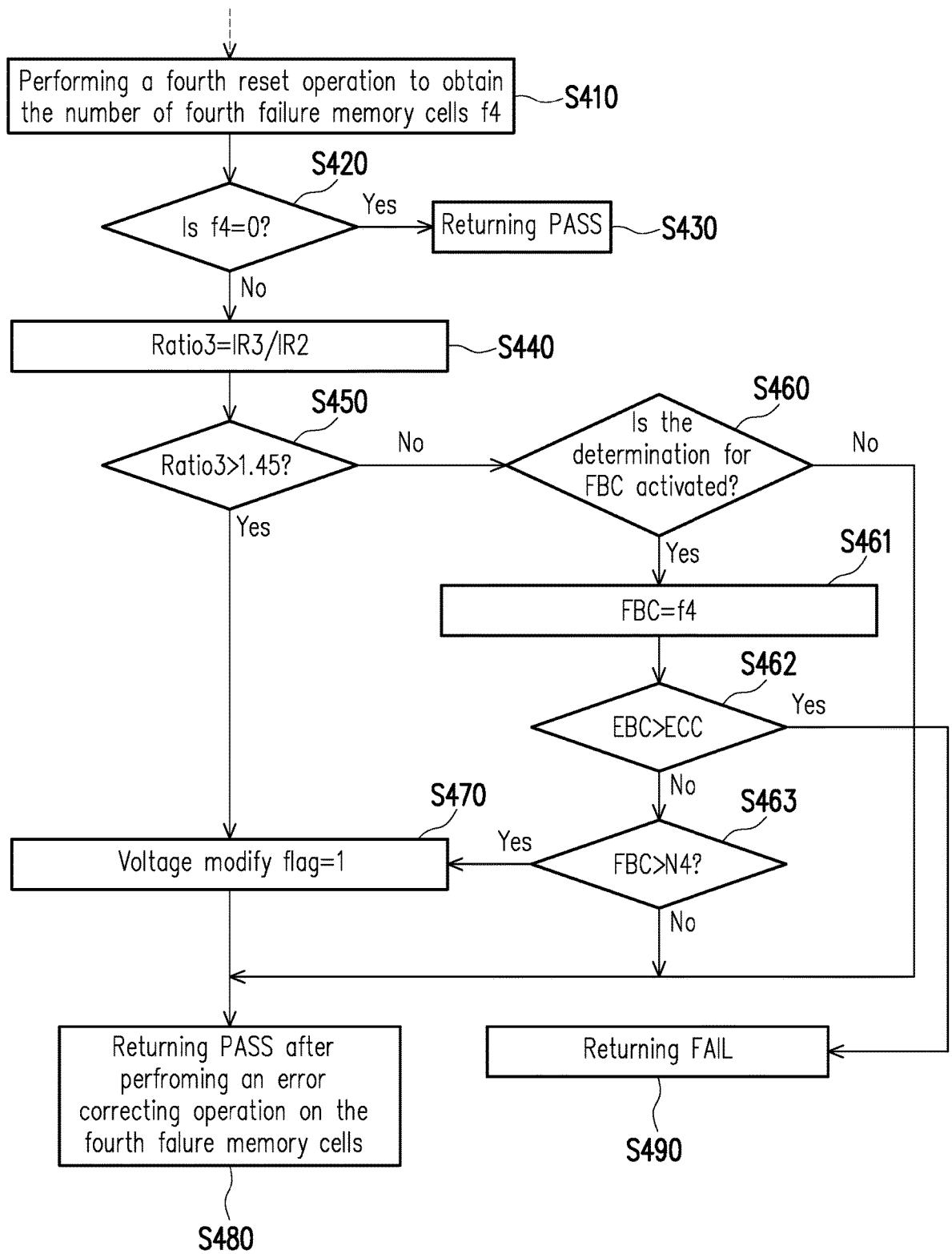
FIG. 4 is a flowchart illustrating a reset method of a non-volatile memory in yet another embodiment of the invention.

With reference to FIG. 4, FIG. 4 is a flowchart illustrating a reset method of a non-volatile memory in yet another embodiment of the invention. In continuation to step S370 of FIG. 3, steps S410 to S490 may be executed subsequently. In step S410, a fourth reset operation is performed, wherein the fourth reset operation is performed on the third failure memory cells, and the number of fourth failure memory cells f4 is obtained. In step S420, whether the number of the fourth failure memory cells f4 is equal to 0 is determined, and step S430 is executed to return the PASS information when the number of the fourth failure memory cells f4 is equal to 0. Otherwise, when the number of the fourth failure memory cells f4 is not equal to 0, step S440 is executed.

In step S440, a ratio Ratio3 between a fourth verifying current IR4 obtained from the verifying operation performed after the fourth reset operation and the third verifying current IR3 obtained from the verifying operation performed after the third reset operation is calculated (Ratio3=IR4/IR3). Next, in step S450, the ratio Ratio3 of each of the fourth failure memory cells is compared with a preset value (=1.45). When one of the ratios Ratio3 is greater than the preset value, step S470 is executed. Otherwise, when all the ratios Ratio3 are not greater than the preset value, step S461 is executed.

In step S460, whether the determination mechanism for the fail bit count FBC is activated is determined, and the fail bit count FBC is made equal to the number of the fourth failure memory cells f4 when it is determined that the mechanism for determining the fail bit count FBC is activated (step S461). Further, in step S462, whether the fail bit count FBC is greater than a maximum correcting count ECC of an error correcting operation is determined. When the fail bit count FBC is greater than the maximum correcting count ECC, step S490 is executed to return FAIL information regarding the reset procedure. In addition, if the fail bit count FBC is not greater than the maximum correcting count ECC, step S463 is executed.

In the step S463, the fail bit count FBC is further compared with a threshold N4. When the fail bit count FBC is greater than the threshold N4, the step S470 is executed. On the other hand, when the fail bit count FBC is not greater than the threshold N4, step S480 is executed. In step S480, the error correcting operation is performed on the fourth failure memory cells to correct bits that cannot be correctly reset, and information regarding that the reset procedure is pass is returned after the error correcting operation is completed.

In addition, in step S470, a voltage modify flag is set to the logic value 1. Then, step S480 is executed to perform the error correcting operation and return the information regarding that the reset procedure is pass.

It should be noted that, the operation of setting the voltage modify flag performed in the step S2110, step S370 and step S470 may be set for identical or different voltage modify flags without particular limitation. In addition, the voltage modify flags in the step S2110, step S370 and step S470 are respectively stored in a plurality of memory cells, or commonly stored in one memory cell. Alternatively, the voltage modify flags in the step S2110, step S370 and step S470 may also be stored in a multi-bit data memory cell (multi-level cell, MLC) in form of multiple bits.

Figure 5:
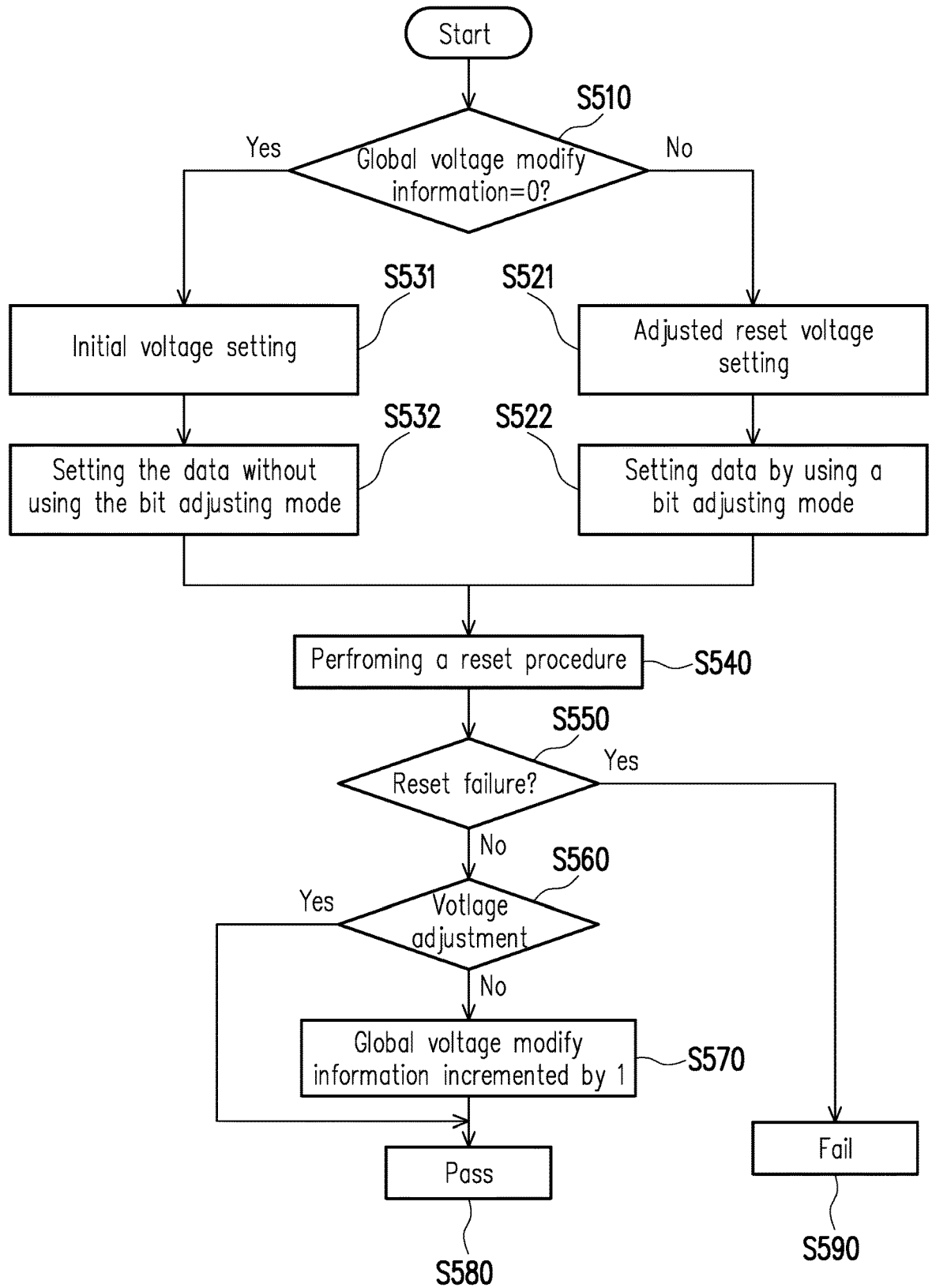
FIG. 5 is a flowchart illustrating a reset method of a non-volatile memory according to an embodiment of the invention.

With reference to FIG. 5, FIG. 5 is a flowchart illustrating a reset method of a non-volatile memory in an embodiment of the invention. In the embodiment of FIG. 5, global voltage modify information is set according to the voltage modify flags in the foregoing embodiments of FIG. 2 to FIG. 4, and the reset voltage is adjusted according to the global voltage modify information. Here, in step S510, whether the global voltage modify information is equal to 0 is determined. When none of the voltage modify flags is set to 1 (the global voltage modify information is equal to 0), steps S531 and S532 are executed to use an initial reset voltage setting to perform a reset procedure (S531) and set data without using a bit adjusting mode (S532). Here, the bit adjusting mode is an approach for reducing the number of data bits that need to be reset by adjusting the bit being 1 in the data to 0, or adjusting the bit being 0 to 1.

Otherwise, when it is determined in step S510 that the global voltage modify information is not equal to 0, it means that the voltage modify flags have been set at least once. Accordingly, an adjusted reset voltage setting is correspondingly selected to perform the reset procedure in step S521, and the data is adjusted by using the bit adjusting mode in step S522. In an embodiment, at least one voltage value set by the adjusted reset voltage setting (e.g., a gate voltage) will be less than a set value set by the initial reset voltage setting.

It should be noted that, although it is disclosed herein that whether the reset voltage setting needs to be adjusted (steps S521 and S531) and whether the bit adjusting mode is used to performed to the reset procedure (steps S522 and S532) may both be determined according to the global voltage modify information, the global voltage modify information may also be used to only determine whether the reset voltage setting needs to be adjusted (steps S521 and S531) or only determine whether the bit adjusting mode is used to performed to the reset procedure (steps S522 and S532) based on design requirements in the invention.

Next, in step S540, the reset procedure is executed, and details regarding the reset procedure are as those described in the foregoing embodiments of FIG. 2 to FIG. 4. In step S550, whether the reset procedure is fail or not can be determined, and step S590 is executed to generate the FAIL information when the reset procedure is fail. In addition, if it is determined in step S550 that the reset procedure is not fail (i.e., the reset procedure is pass), whether the voltage modify flag is 0 is determined in step S560. When the voltage modify flag is set to 1, the global voltage modify information is incremented by 1, and then step S580 is executed. When the voltage modify flag is 0, step S580 is executed to transmit the information regarding that the reset procedure is pass.

Figure 6:
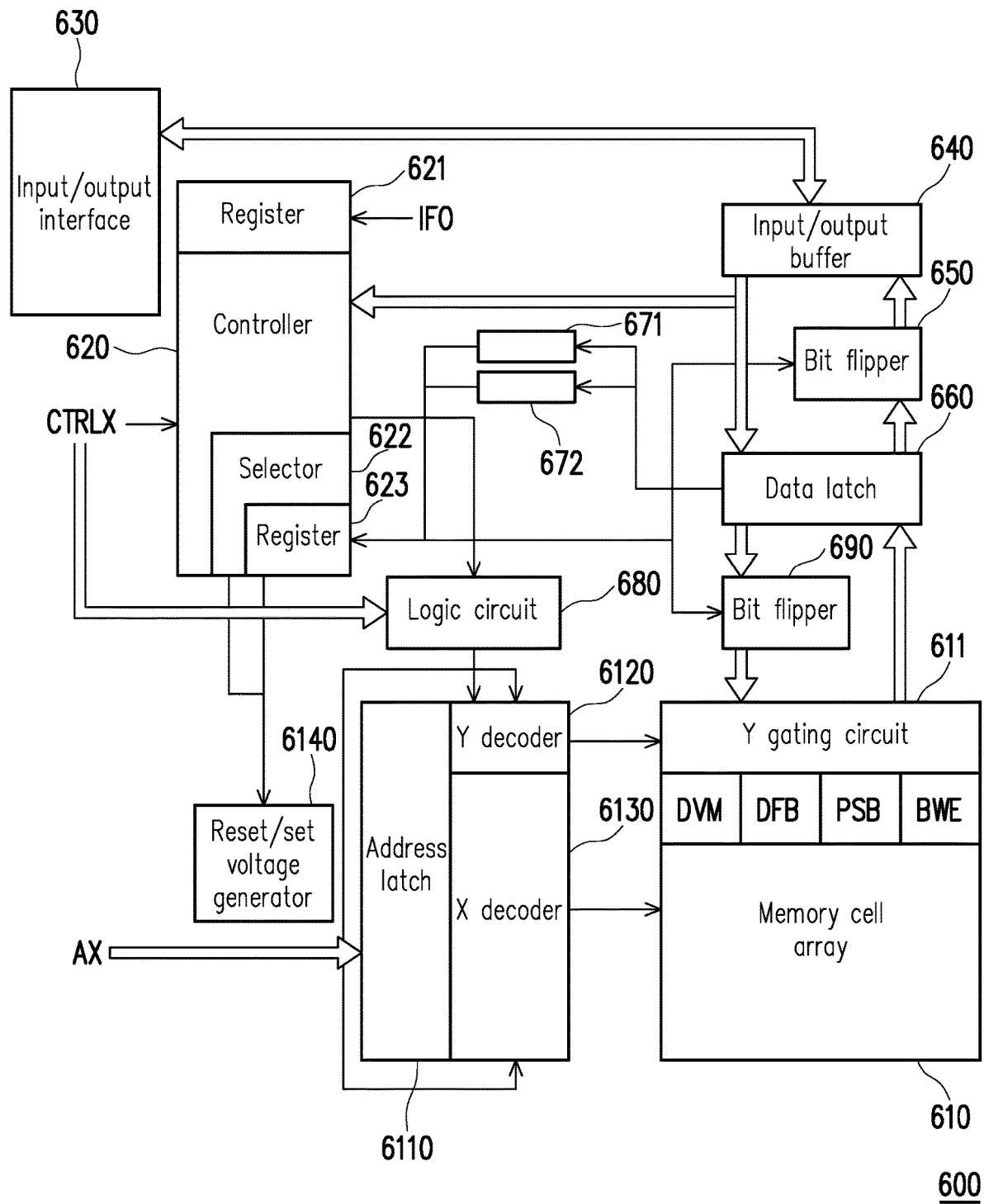
FIG. 6 is a block diagram of a non-volatile memory in an embodiment of the invention.

With reference to FIG. 6, FIG. 6 is a block diagram of a non-volatile memory in an embodiment of the invention. A non-volatile memory 600 includes a memory cell array 610, a Y gating circuit 611, a controller 620, an input/output interface 630, an input/output buffer 640, bit flippers 650 and 690, a data latch 660, an operator 671, a counter 672, a logic circuit 680, an address latch 6110, a Y decoder 6120, an X decoder 6130 and a reset/set voltage generator 6140. The controller 620 includes registers 621 and 623 and a selector 622. The register 621 may be used to receive a plurality of information IFO (e.g., the preset values and the thresholds mentioned in the foregoing embodiments), and the register 623 may be used to store the global voltage modify information mentioned in the foregoing embodiment. The information IFO may be input externally or generated according to whether a fuse circuit is burnt out. The selector 622 is a priority selecting circuit used to preferentially select the voltage adjusting mode or preferentially select the bit adjusting mode when the reset and set operations are performed on the memory cells. The controller 620 receives a control signal CTRLX, and performs various access operations on the memory cell array 610 according to the control signal CTRLX.

It should be noted that, the operator 671 is used to calculate the ratios between the verifying currents in the foregoing embodiments, and transmit a calculation result to the controller 620. The counter 672 may be used to count the fail bit count and may transmit a count result to the controller 620.

On the other hand, the reset/set voltage generator 6140 is used to generate a set voltage or a reset voltage, and transmit the generated set voltage or the generated reset voltage to the memory cell array 610 so as to perform the set or reset operation on the memory cells therein. In this embodiment, by performing steps in the foregoing embodiments and according to the set state of the reset modified flag, the controller 620 can provide commands to the reset/set voltage generator 6140 so the reset/set voltage generator 6140 can correspondingly adjust the voltage value of the reset voltage.

The address latch 6110 receives address information AX, performs a decoding operation on the address information AX through the Y decoder 6120 and the X decoder, and generates a two-dimensional access address to perform the access operations on the memory cells in the memory cell array 610.

The input/output interface 630 is used as a signal transmission interface of the non-volatile memory 600 to the outside. The input/output buffer 640 is used to temporarily store read data read from the memory cell array 610, or write data to be written into the memory cell array 610. The bit flipper 650 is used to perform operations in the bit adjusting mode to correctly generate the read data, and the data latch 660 is used to latch to-be-processed data. The bit flipper 690 is also used to perform operations in the bit adjusting mode, flip the to-be-processed data and generate data to be actually written into the memory cell array 610. On the other hand, the memory cell array 610 is stored with a plurality of flags DVM, DFB, PSB and BWE, and used to record a plurality of operating modes for resetting and setting the data of the non-volatile memory 600.

In summary, according to the invention, the voltage modify flag is set according a variation state of the verifying current after the reset operation is performed the memory cell, and the voltage value of the reset voltage is adjusted by the method of setting the voltage modify flag. In this way, the reset operation may be optimized for the memory cells to improve the working efficiency of the reset operation for the memory cells.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A reset method of non-volatile memory, comprising:
    performing a first reset operation on a plurality of memory cells;
    recording a plurality of first verifying currents respectively corresponding to a plurality of first failure memory cells;
    performing a second reset operation on the first failure memory cells, and verifying a plurality of second failure memory cells to obtain a plurality of second verifying currents;
    setting a first voltage modify flag according to a plurality of first ratios between the second verifying currents and the respectively corresponding first verifying currents; and
    adjusting a reset voltage for performing the first reset operation and the second reset operation according to the first voltage modify flag.

2. The reset method of claim 1, wherein a step of setting the first voltage modify flag according to the first ratios between the second verifying currents and the respectively corresponding first verifying currents comprises:
    determining whether each of the first ratios is greater than a preset value; and
    setting the first voltage modify flag when at least one of the first ratios is greater than the preset value.

3. The reset method of claim 1, further comprising:
    performing a third reset operation on the second failure memory cells, and verifying a plurality of third failure memory cells to obtain a plurality of third verifying currents;
    setting a second voltage modify flag according to a plurality of second ratios between the third verifying currents and the respectively corresponding second verifying currents; and
    adjusting the reset voltage according to the first voltage modify flag and the second voltage modify flag.

4. The reset method of claim 3, wherein a step of setting the second voltage modify flag according to the second ratios between the third verifying currents and the respectively corresponding second verifying currents comprises:
    determining whether each of the second ratios is greater than a preset value; and
    setting the second voltage modify flag when at least one of the second ratios is greater than the preset value.

5. The reset method of claim 3, further comprising:
    counting a first fail bit count of the third failure memory cells verified as a reset failure after the third reset operation; and
    adjusting the second voltage modify flag according to the first fail bit count.

6. The reset method of claim 5, wherein a step of adjusting the second voltage modify flag according to the first fail bit count comprises:
    setting the second voltage modify flag when the fail bit count is greater than a threshold.

7. The reset method of claim 5, further comprising:
    performing a fourth reset operation on the third failure memory cells verified as the reset failure after the third reset operation, and verifying a plurality of fourth failure memory cells to obtain a plurality of fourth verifying currents;
    setting a third voltage modify flag according to a ratio between each of the fourth verifying currents and each of the third verifying currents; and
    adjusting the reset voltage according to the first voltage modify flag, the second voltage modify flag and the third voltage modify flag, wherein the first voltage modify flag, the second voltage modify flag and the third voltage modify flag may be identical or different.

8. The reset method of claim 7, when the first voltage modify flag, the second voltage modify flag and the third voltage modify flag are different, the reset method further comprising:
    providing a plurality of memory cells for respectively storing the first voltage modify flag, the second voltage modify flag and the third voltage modify flag; or
    providing a multi-bit data memory cell for storing the first voltage modify flag, the second voltage modify flag and the third voltage modify flag.

9. The reset method of claim 7, wherein a step of setting the third voltage modify flag according to the ratio between each of the fourth verifying currents and each of the third verifying currents comprises:
    setting the third voltage modify flag when the fail bit count is greater than a threshold.

10. The reset method of claim 7, further comprising:
    counting a second fail bit count of the fourth failure memory cells verified as the reset failure after the fourth reset operation; and comparing the second fail bit count with a maximum correcting count of an error correcting operation to generate a comparison result, and performing an error bit correcting operation or ending a reset operation according to the comparison result.

11. The reset method of claim 10, wherein a step of comparing the second fail bit count with the maximum correcting count of the error correcting operation to generate the comparison result, and performing the error bit correcting operation or ending the reset operation according to the comparison result comprises:
   ending the reset operation when the second fail bit count is greater than the maximum correcting count; and
   performing the error correcting operation when the second fail bit count is not greater than the maximum correcting count.

12. A non-volatile memory, comprising:
   a memory cell array; and
   a controller, coupled to the memory cell array, and configured for:
      performing a first reset operation on a plurality of memory cells;
      recording a plurality of first verifying currents respectively corresponding to the first failure memory cells;
      performing a second reset operation on the first failure memory cells, and verifying a plurality of second failure memory cells to obtain a plurality of second verifying currents;
      setting a first voltage modify flag according to a plurality of first ratios between the second verifying currents and the respectively corresponding first verifying currents; and
      adjusting a reset voltage for performing the first reset operation and the second reset operation according to the first voltage modify flag.

13. The non-volatile memory of claim 12, further comprising:
   an operator, coupled to the controller and the memory cell array, and configured for calculating a ratio between each of the second verifying currents and each of the first verifying currents.

14. The non-volatile memory of claim 12, wherein the controller is further configured for:
   determining whether each of the first ratios is greater than a preset value; and
   setting the first voltage modify flag when at least one of the first ratios is greater than the preset value.

15. The non-volatile memory of claim 12, wherein the controller is further configured for:
   performing a third reset operation on the second failure memory cells verified as a reset failure after the second reset operation, and verifying a plurality of third failure memory cells to obtain a plurality of third verifying currents;
   setting a second voltage modify flag according to a plurality of second ratios between the third verifying currents and the respectively corresponding second verifying currents; and
   adjusting the reset voltage according to the first voltage modify flag and the second voltage modify flag.

16. The non-volatile memory of claim 15, wherein the controller is further configured for:
   determining whether each of the second ratios is greater than a preset value; and
   setting the second voltage modify flag when at least one of the second ratios is greater than the threshold.

17. The non-volatile memory of claim 15, further comprising:
   a counter, configured for counting a first fail bit count of the third failure memory cells verified as the reset failure after the third reset operation, and
   the controller is further configured for:
      adjusting the second voltage modify flag according to the first fail bit count.

18. The non-volatile memory of claim 17, wherein the controller is further configured for:
   performing a fourth reset operation on a plurality of third failure memory cells verified as the reset failure after the third reset operation, and verifying a plurality of fourth failure memory cells to obtain a plurality of fourth verifying currents;
   setting a third voltage modify flag according to a ratio between each of the fourth verifying currents and each of the third verifying currents; and
   adjusting the reset voltage according to the first voltage modify flag, the second voltage modify flag and the third voltage modify flag, wherein the first voltage modify flag, the second voltage modify flag and the third voltage modify flag may be identical or different.

19. The non-volatile memory of claim 18, wherein when the first voltage modify flag, the second voltage modify flag and the third voltage modify flag are different, the first voltage modify flag, the second voltage modify flag and the third voltage modify flag are respectively stored in a plurality of memory cells, or the first voltage modify flag, the second voltage modify flag and the third voltage modify flag are stored together in a multi-bit data memory cell.

20. The non-volatile memory of claim 18, wherein the counter is further configured for:
   counting a second fail bit count of the fourth failure memory cells verified as the reset failure after the fourth reset operation, and
   the controller is further configured for:
      comparing the second fail bit count with a maximum correcting count of an error correcting operation to generate a comparison result, and performing an error bit correcting operation or ending a reset operation according to the comparison result.

* * * * *